(12) United States Patent
Maget

(10) Patent No.: US 6,906,904 B2
(45) Date of Patent: Jun. 14, 2005

(54) INTEGRATED, TUNABLE CAPACITANCE

(75) Inventor: Judith Maget, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/712,664

(22) Filed: Nov. 13, 2003

(65) Prior Publication Data

US 2004/0094824 A1 May 20, 2004

Related U.S. Application Data

(63) Continuation of application No. PCT/DE02/01993, filed on May 29, 2002.

(30) Foreign Application Priority Data

May 29, 2001 (DE) .......................................... 101 26 116

(51) Int. Cl.$^7$ ................................................ H01G 5/01
(52) U.S. Cl. ....................... 361/271; 361/277; 361/278; 361/279; 346/860; 346/861
(58) Field of Search ................................. 346/860–861; 361/271–290

(56) References Cited

U.S. PATENT DOCUMENTS

| | | | |
|---|---|---|---|
| 5,965,912 A | 10/1999 | Stolfa et al. | |
| 6,034,388 A | 3/2000 | Brown et al. | |
| 6,172,378 B1 | 1/2001 | Hull et al. | |

FOREIGN PATENT DOCUMENTS

| | | |
|---|---|---|
| EP | 0 800 218 | 10/1997 |
| JP | 03147376 A | 6/1991 |

OTHER PUBLICATIONS

Hung, C.–M. et al.: "A 25.9–GHz Voltage–Controlled Oscillator Fabricated in a CMOS Process", Symposium on VLSI Circuits Digest of Technical Papers, IEEE, 2000, pp. 100–101.

Maget, J. et al.: "A Varactor with High Capacitance Tuning Range in Standard 0.25 µm CMOS Technology", 4 pages.

Burghartz, J. N. et al.: "Integrated RF and Microwave Components in BiCMOS Technology", IEEE Transactions on Electron Devices, vol. 43, No. 9, Sep. 1996, pp. 1559–1570.

Wong, W. M. Y. et al.: "A Wide Tuning Range Gated Varactor", IEEE Journal of Solid–State Circuits, vol. 35, No. 5, May 2000, pp. 773–779.

Svelto, F. et al.: "A Three Terminal Varactor for RF IC's in Standard CMOS Technology", IEEE Transactions on Electron Devices, vol. 47, No. 4, Apr. 2000, pp. 893–895.

Tiebout, M.: "A Fully Integrated 1.3GHz VCO for GSM in 0.25µm Standard CMOS with a Phasenoise of—142dBc/Hz at 3MHz Offset", European Microwave Week, 2000, 4 pages.

Andreani, P. et al.: "On the Use of MOS Varactors in RF VCO's", IEEE Journal of Solid–State Circuits, vol. 35, No. 6, Jun. 2000, pp. 905–910.

Porret, A.–S. et al.: "Design of High–Q Varactors for Low–Power Wireless Applications Using a Standard CMOS Process", IEEE Journal of Solid–State Circuits, vol. 35, No. 3, Mar. 2000, pp. 337–345.

*Primary Examiner*—Fetsum Abraham
(74) *Attorney, Agent, or Firm*—Laurence A. Greenberg; Werner A. Stemer; Ralph E. Locher

(57) ABSTRACT

An integrated, tunable capacitance is specified in which the quality factor is improved by virtue of the fact that, instead of source/drain regions, provision is made of highly doped well terminal regions having a deep depth, for example formed as collector deep implantation regions. This reduces the series resistance of the tunable capacitance. The integrated, tunable capacitance can be used for example in integrated voltage-controlled oscillator circuits in which a high quality factor is demanded.

9 Claims, 3 Drawing Sheets

INTEGRATED, TUNABLE CAPACITANCE

CROSS-REFERENCE TO RELATED APPLICATION

This application is a continuation of copending International Application No. PCT/DE02/01993, filed May 29, 2002, which designated the United States and was not published in English.

BACKGROUND OF THE INVENTION

Field of the Invention

The present invention relates to an integrated, tunable capacitance.

Integrated, tunable capacitances are used in large numbers for the construction of resonant circuits. Resonant circuits of this type are constructed as an LC oscillator, for example, in which the capacitance is usually formed as a frequency-detuning element. The inductances that, together with the capacitance, determine the resonant circuit frequency and are usually realized in the form of coils in this case normally have a constant inductance value.

Voltage controlled oscillators (VCOs) have, as an output signal, a frequency-adjustable high-frequency signal which can be detuned depending on a voltage present on the input side.

In order to obtain a large tuning range, it is necessary, on account of the usually constant inductance already mentioned to strive to obtain a large variation ratio of the capacitance, that is to say a large quotient of maximum and minimum capacitance that can be set.

Furthermore, it is desirable, for example when the integrated, tunable capacitance is employed in a VCO, to obtain a high quality factor, since the quality factor of the LC resonant circuit is incorporated quadratically into the phase noise of the circuit. In this case, the quality factor of the tunable capacitance can be determined from the series circuit of the variable capacitance C and series resistances R that are possibly present, using the formula $Q=1/\omega RC$; where $\omega$ is equal to the operating frequency, R is equal to the series resistance and C is equal to the variable capacitance. Therefore, in order to obtain high quality factors, it is necessary to strive to make the series resistance as small as possible with respect to the capacitance.

Integrated, tunable capacitances can be produced in various technologies and with various constructions. Variable-capacitance diodes formed as tunable capacitances, which can be integrated either as single-ended or as differentially configured devices, see for example the reference by A.-S. Porret, T. Melly, C. C. Enz, E. A. Vittoz, entitled "Design of High-Q Varactors for Low-Power Wireless Applications Using a Standard CMOS Process", IEEE Journal of Solid-State Circuits, Vol. 35, No. 3, March 2000, pp. 337–345.

Furthermore, the tunable capacitances may also be formed as NMOS or PMOS field-effect transistors with short-circuited source/drain regions for example in N-type wells, see for example the reference by P. Andreani, S. Mattisson, entitled "On the Use of MOS Varactors in RF VCO's", IEEE Journal of Solid-State Circuits, Vol. 35, No. 6, June 2000, pp. 905–910.

The document by M. Tiebout, entitled "A Fully Integrated 1.3 GHz VCO for GSM in 0.25 µm Standard CMOS with a Phase Noise of –142 dBc/Hz at 3 MHz Offset", European Microwave Week 2000, furthermore discloses a VCO with NMOS varactors.

A differentially operating PMOS-FET, an NMOS-FET in an n-type well and also an NMOS-FET in an n-type well without connected diffusion regions are disclosed in the above-entioned Porret et al. literature reference.

An NMOS field-effect transistor formed in an N-type well with p+-type extraction regions is specified in the document by F. Svelto et al.: entitled "A Three Terminal Varactor for RFIC's in Standard CMOS Technology", IEEE Transactions on Electron Devices, volume 47, No. 4, April 2000, pages 893–895.

The paper by J. N. Burghartz, M. Soyuer and K. A. Jenkins entitled "Integrated RF and Microwave Components in BiCMOS Technology", IEEE Transactions on Electron Devices, Vol. 43, No. 9, September 1996, specifies PN diodes produced using bipolar fabrication technology which operate as base-collector diodes.

Finally, the paper by Wallace Ming Yip Wong et al., entitled "A Wide Tuning Range Gated Varactor", IEEE Journal of Solid-State Circuits, Vol. 35, No. 5, May 2000, pp. 773–779 specifies a so-called gated varactor.

Of the previous solutions mentioned for providing a tunable capacitance, those formed as a gated varactor and as an NMOS field-effect transistor in an n-type well with p+-type extraction regions are those with the largest possible tuning range to date. In this case, the high-frequency signal is usually applied to the gate terminal, and a second terminal is used for feeding the tuning voltage, depending on the embodiment.

The total effective capacitance of a component of this type depends on its respective operating state, such as inversion, depletion or accumulation or enhancement, and is determined by the voltages at the nodes mentioned. In this case, the generally constant parasitic capacitances of a device of this type generally always have an additive influence.

In inversion, as well as in accumulation, the maximum capacitance that can be obtained results as the sum of the gate oxide capacitance, determined by gate area and thickness of the gate oxide layer, and from the constant parasitic capacitances between gate and the source/drain regions. By contrast, the minimum capacitance that can be obtained results, in depletion, as a series circuit of the gate oxide capacitance and the depletion capacitance and, in parallel therewith, the constant parasitic capacitances between gate and the source/drain regions. For a given gate area and a given technology which determines the gate oxide layer thickness, the tuning range can consequently be increased only by reducing the minimum capacitance and/or the constant capacitances.

In order, when the tunable capacitance is used for example in an LC-VCO, to obtain an acceptable phase noise of the VCO, it is desirable to keep down series resistances, as explained above, in the LC circuit as well.

For this purpose, as is customary in the case of high-frequency transistors, use is made of so-called finger structures and also transistors having a short gate length.

By contrast, the parasitic capacitances are largely independent of the gate length. Only the variable part of the capacitances decreases with the gate length. The smaller the gate length, therefore, the larger the parasitic capacitances are in comparison with the variable capacitances. Therefore, in order to obtain higher quality factors, it has been necessary hitherto to accept obtaining a smaller tuning range. The converse statement also holds true: the larger the gate length, the lower the significance of the parasitic capacitances and, accordingly, a larger tuning range can be obtained. However, a larger gate length leads to increasing series resistances and thus to a poorer quality factor.

SUMMARY OF THE INVENTION

It is accordingly an object of the invention to provide an integrated, tunable capacitance that overcomes the above-mentioned disadvantages of the prior art devices of this general type, which has a large tuning range and in which the quality factor is improved.

With the foregoing and other objects in view there is provided, in accordance with the invention, an integrated, tunable capacitance. The capacitance contains a semiconductor body having a semiconductor region of a first conductivity type embodied as a well, and the semiconductor body is of a second conductivity type. At least one first insulating region is disposed in the semiconductor body. The first insulating region has a common interface with the semiconductor region and a first layer thickness. A second insulating region is provided and has a common interface with the semiconductor region and a common interface with the first insulating region. A control electrode is disposed on the second insulating region. At least one well terminal region is provided for connecting the semiconductor region to a control voltage for tuning the capacitance. The well terminal region has a higher dopant concentration than the semiconductor region and a second layer thickness greater than the first layer thickness.

The highly doped well terminal regions, which extend into a comparatively large depth in the semiconductor material, bring about a low series resistance of the integrated, tunable capacitance in conjunction with a high variation ratio, that is to say with a comparatively large quotient of maximum and minimum capacitance that can be set for the tunable capacitance.

The highly doped well terminal regions serve for connecting the varactor according to the invention to a terminal for feeding a tuning voltage for setting the capacitance of the varactor, while the gate electrode is preferably formed as a high-frequency terminal.

The semiconductor body may have a substrate terminal that can be connected to a reference-ground potential terminal or a device for feeding a bias voltage.

On account of the lateral extent of the well terminal regions in a direction parallel to the active front side of the semiconductor body under the first insulating region, it is possible to further reduce the series resistances of the varactor. In this case, however, care must be taken to ensure that the extent of the well terminal region along below the first insulating region does not reach under the second insulating region, which is preferably formed as a gate oxide region.

The described well terminal regions having a high dopant concentration which extend into the semiconductor body to a large depth may be realized for example using a BiCMOS fabrication technology as so-called collector deep implantations instead of the source/drain regions that are usually provided in the case of CMOS varactors.

The integrated, tunable capacitance is preferably embodied symmetrically, that is to say with in each case two first insulating regions with in each case two adjacent well terminal regions which each extend to a greater depth than the first insulating regions. In this case, the first insulating regions adjoin the second insulating region and surround the semiconductor region of the first conductivity type that is embodied in the form of a well.

The well terminal regions according to the present principle are distinguished by the fact that they reach a significantly larger depth of the doping regions in relation to source/drain regions.

In a preferred embodiment of the present invention, a buried layer of the first conductivity type with the higher dopant concentration adjoins the at least one well terminal region.

A buried layer below the semiconductor region embodied in the form of a well and adjoining the at least one well terminal region further improves the quality factor of the tunable capacitance since the series resistances are reduced further.

An even further improvement in the quality factor of the configuration can be achieved by virtue of the fact that the buried layer is disposed directly below the at least one first insulating region. However, if the doping conditions are such that, without the buried layer, the maximum space charge zone is deeper than the first insulating layer, then the tuning range would be reduced by a buried layer directly below the first insulating layer. If the tuning range is not to be reduced by the buried layer, with a quality factor that is improved to a slightly lesser extent, then the buried layer advantageously begins directly (in the vertical direction) adjoining the maximally extended space charge zone. However, they always preferably adjoin the well terminal regions, that is to say do not lie deeper.

Given a symmetrical embodiment of the tunable capacitance, in cross section the semiconductor region embodied in the form of a well below the gate electrode is enclosed by well terminal regions and buried layer.

In a further preferred embodiment of the present invention, the at least one well terminal region is formed using bipolar fabrication technology.

The well terminal regions may be formed for example as collector deep implantations, produced in bipolar process steps of a BiCMOS fabrication.

In a further preferred embodiment of the present invention, the at least one well terminal region in each case has a common interface with the second insulating region and the semiconductor region below the gate electrode.

Such a direct linking of the well terminal regions to the second insulating region and the semiconductor region directly underneath results in a further improvement in the quality factor. However, if the entire chip area taken up by the tunable capacitance is considered, then the direct linking described takes up merely a comparatively small area in order to avoid an undesirable increase in the parasitic capacitances.

In a manner that is customary in the case of field-effect transistors for radio frequency applications, the tunable capacitance is preferably formed in a so-called finger structure with a plurality of gate electrode tracks running parallel.

In a further preferred embodiment of the present invention, provision is made of a region for connection to a reference-ground potential, which is of a second conductivity type and also highly doped and in each case has a common interface with the second insulating region and the semiconductor region below the gate electrode.

As in the case of the already described direct linking of the well terminal regions to the semiconductor region embodied in the form of a well directly along the gate oxide or the second insulating region, through omission of the first insulating region at a few locations of the tunable capacitance, the described direct linking to the reference-ground potential also takes up a small area with regard to the entire chip area taken up by the tunable capacitance or is effected only at comparatively few locations in the semiconductor.

The described direct linking to the reference-ground potential by a highly doped region of the opposite conductivity type with regard to the semiconductor region embodied in the form of a well makes it possible to achieve an even further improvement in the quality factor.

In a further preferred embodiment of the present invention, the second insulating region has a third layer thickness, which is significantly smaller than the first layer thickness of the first insulating region. The second insulating region is preferably formed as a so-called gate oxide layer in a CMOS fabrication step. The first insulating regions, by contrast, are preferably formed as so-called thick oxide regions, for example as so-called shallow trench insulation (STI) for obtaining an improved variation ratio.

Other features which are considered as characteristic for the invention are set forth in the appended claims.

Although the invention is illustrated and described herein as embodied in an integrated, tunable capacitance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
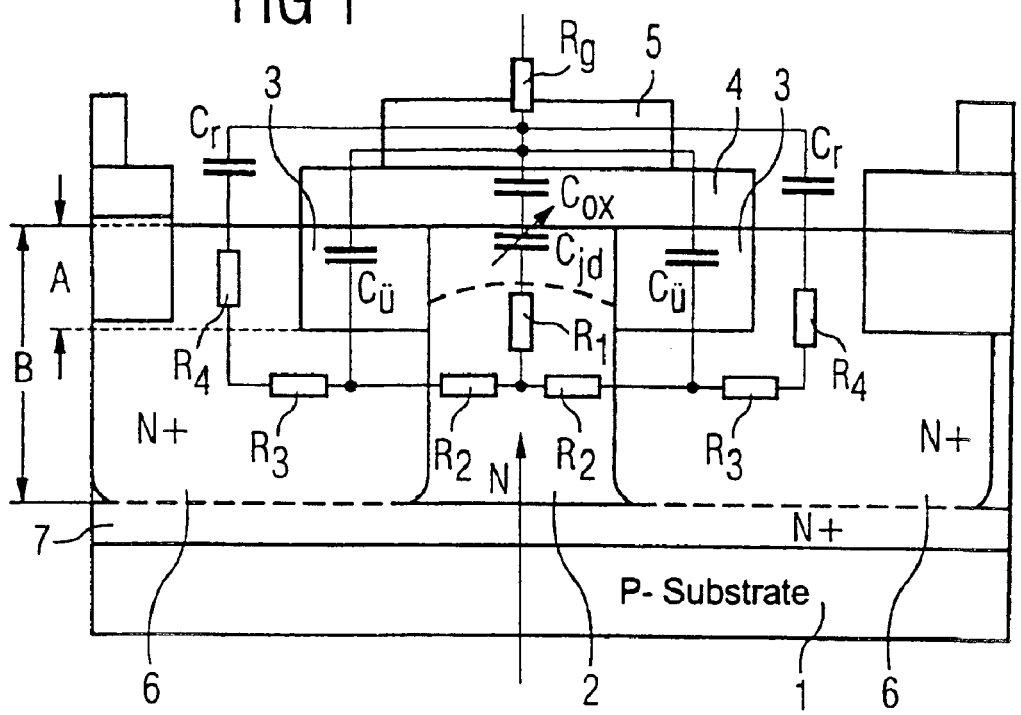
FIG. 1 is a diagrammatic, cross-sectional view through an exemplary embodiment of a fundamental configuration of a tunable capacitance according to the invention.

Referring now to the figures of the drawing in detail and first, particularly, to FIG. 1 thereof, there is shown an integrated tunable capacitance produced using a BiCMOS fabrication technology. The tunable varactor has a semiconductor body 1, which is formed as a P-type substrate with a low dopant concentration. A semiconductor region 2 embodied in the form of a well is situated in the semiconductor body 1, the semiconductor region 2 being N-doped. Furthermore, two first insulating regions 3 fabricated as thick oxide regions, in the form of so-called shallow trench insulation (STI) regions, are introduced in the semiconductor body 1. They each have a common interface with the semiconductor region 2 embodied in the form of a well. A second insulating region 4, applied as a gate oxide layer in a CMOS fabrication step, in each case has a common interface with the two first insulating regions 3 and also with the semiconductor region 2 embodied in the form of a well. Disposed above the gate oxide layer 4 is a gate electrode 5 formed as a polycrystalline layer.

In the case of the present varactor, the gate electrode 5 is one of the two terminals with which electrical contact is to be made and to which preferably a high-frequency signal can be fed. The other terminal of the present varactor with which electrical contact is to be made is produced with two N+-type well terminal regions 6 which are to be electrically short-circuited and are formed as so-called collector deep implantations in a bipolar fabrication step and to which can preferably be fed a tuning voltage for controlling the capacitance of the varactor. The N+-type well terminal regions 6 are distinguished by the fact that they have a very large thickness B or depth in the semiconductor body which significantly exceeds a thickness A of the thick oxide regions 3 to which they are adjacent. The N+-type well terminal regions 6 adjoin the respective thick oxide region 3, on the one hand, and the N-type well 2, on the other hand. For the layer thicknesses B, A of well terminal regions 6 and first insulating regions 3, B>A accordingly holds true.

The dopant concentration of the well terminal regions 6 is significantly higher than that of the well 2, but have the same conductivity type. In addition to the large extent of the well terminal regions 6 into the depth of the semiconductor body 1, the well terminal regions 6 additionally have a lateral extent below the thick oxide regions 3 in the direction of the N-type well 2, which may be governed by a desired lateral diffusion. In this case, the width of the well terminal regions 6 is to be set such that the lateral extent reaches as far as possible below the thick oxide regions 3 in the direction of the N-type well 2, but not beyond the thick oxide regions 3 into the N-type well region 2 below the gate 5.

Finally, the integrated tunable varactor shown has a buried layer 7, which adjoins the two symmetrically disposed N+-type well terminal regions 6 and is likewise of the same conductivity type as the well terminal regions 6 and likewise highly doped. As a result of this, in the cross section shown, the N-type well 2 is completely enclosed by the gate oxide 4, the thick oxide regions 3, the well terminal regions 6 and the buried layer 7. In this case, the buried layer 7 is disposed as near as possible to the thick oxide regions 3 in order to obtain a highest possible quality factor of the tunable capacitance. However, if the doping conditions are such that, without the buried layer 7, the maximum space charge zone is deeper than the first insulating layer 3, then the tuning range would be reduced by the buried layer 7 directly below the first insulating layer 3. If the tuning range is not to be reduced by the buried layer 7, with a quality factor that is improved to a slightly lesser extent, then the buried layer 7 advantageously begins directly (in the vertical direction) adjoining the maximally extended space charge zone. However, they should always adjoin the well terminal regions 6, that is to say not lie deeper.

The buried layer 7 runs parallel to the gate oxide layer 4 along the active front side of the semiconductor body 1. For a better understanding of the electrical conditions in the integrated tunable capacitance, both the desired and the parasitic electrical equivalence elements are depicted in FIG. 1, which determine on the one hand the series resistance of the varactor and on the other hand the ratio of the variable capacitance to the parasitic capacitances and thus the variation ratio of the capacitance. In this case, the variation ratio is defined as the quotient of maximum and minimum capacitance value that can be set.

Specifically $C_{jd}$ designates an adjustable space charge capacitance, $C_{ox}$ designates a gate oxide capacitance, $C_r$ designates fringing capacitances, and $C_{\bar{u}}$ designates an overlap capacitance. The resistances $R_g$ and $R_1$ to $R_4$ determine the series resistance that occurs in the varactor, which, together with the capacitances, defines the quality factor of the varactor.

In order to obtain a large variation ratio, it is desirable to obtain a large variation range of the space charge capacitance $C_{jd}$ in conjunction with low, generally fixed, capacitances $C_r$ and $C_{\bar{u}}$. A series resistance that is as low as possible is desirable in order to increase the quality factor.

In the case of the present configuration, the quality factor is improved by virtue of the fact that the resistances $R_3$ and $R_4$ are significantly reduced on account of the highly doped collector deep implantation regions 6 in comparison with a CMOS varactor. The buried layer 7, which is likewise highly doped, additionally makes it possible to reduce primarily the resistances $R_2$.

In the case of the present arrangement, the collector deep implantation regions 6 replace the source/drain regions which are usually provided in CMOS varactors and are produced using CMOS fabrication technology. Compared with conventional CMOS source/drain regions, the collector deep implantation regions 6 described have a significantly larger depth, that is to say layer thickness B, and, moreover, the lateral extent already described.

The thick oxide regions 3 formed as STI are dimensioned such that an almost complete underdiffusion through the well terminal regions 6 is possible.

Figure 2:
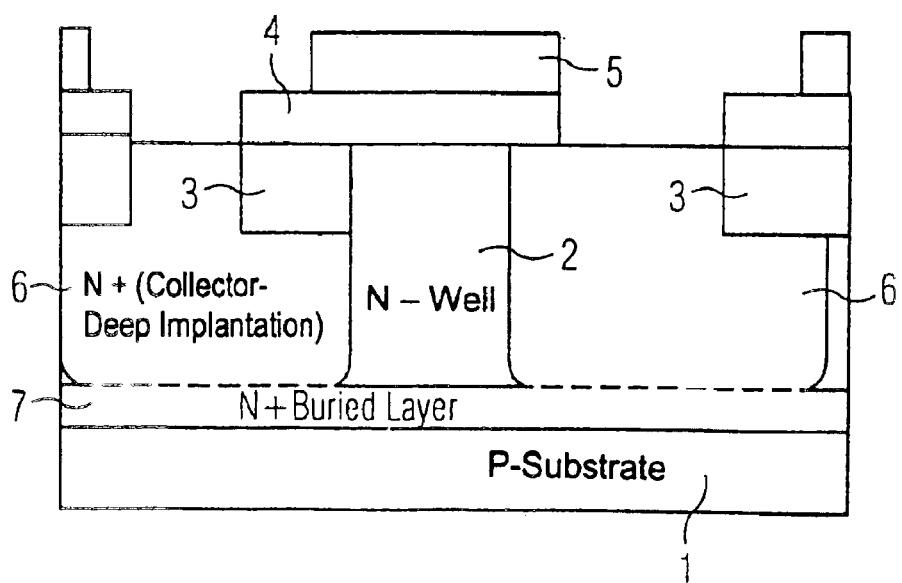
FIG. 2 is a cross-sectional view through the subject matter developed with regard to FIG. 1 with direct linking of the semiconductor region embodied in the form of a well along the gate oxide to a well terminal region.

FIG. 2 shows a development of the tunable capacitance in accordance with FIG. 1, in which the quality factor can additionally be improved by achieving, at a few locations of the tunable capacitance, a direct linking of the N+-type collector deep implantation regions 6 to the gate oxide 4 and the N-type well 2 directly below the gate oxide 4 through omission of the thick oxide regions 3 at a few locations in the semiconductor body 1. As a result, the region below the gate electrode 5, that is to say between the gate oxide regions 3 in accordance with FIG. 1, is directly linked to the well terminal region 6. This further reduces the series resistance of the varactor.

Figure 3:
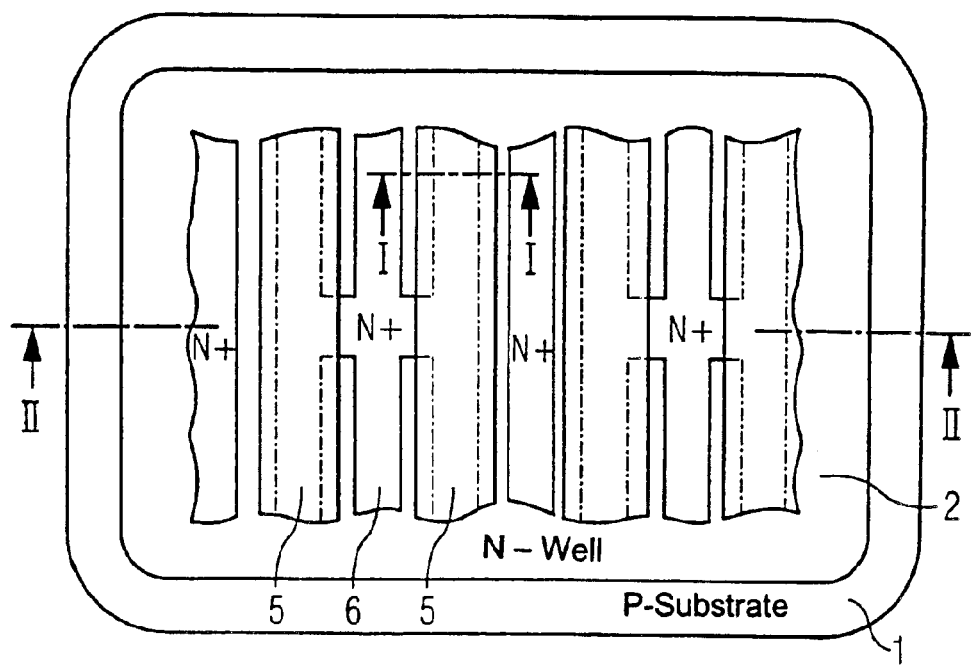
FIG. 3 is a diagrammatic, plan view of the subject matter in accordance with FIGS. 1 and 2.

FIG. 3 shows the BiCMOS varactor structure according to the invention formed in a finger structure in a plan view of the integrated tunable capacitance in accordance with FIGS. 1 and 2. In this case, an illustration that is not true to scale reveals how, by way of example, it is possible to achieve the situation in which the described direct linkings of the region 2 below the gate electrode 5 to the collector deep implantation regions 6 take up merely a small area in relation to the entire varactor area, in order to prevent the parasitic overlap and fringing capacitances from discernibly increasing.

In this case, the direct linking regions described are depicted along the cross section line II—II.

Figure 4:
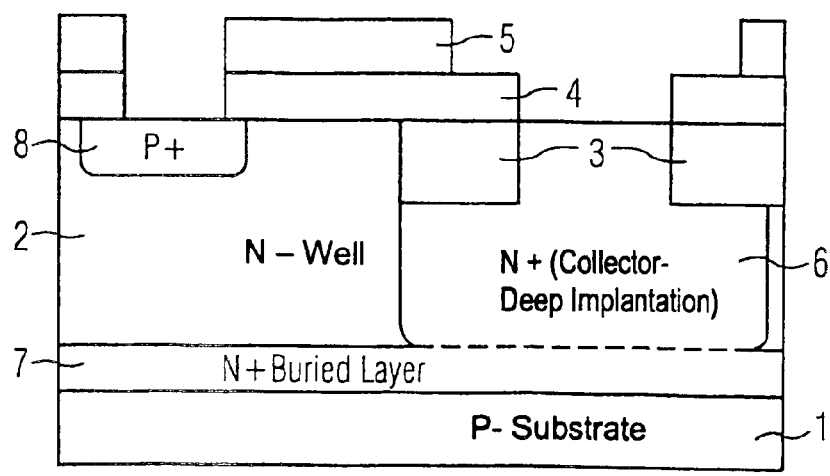
FIG. 4 is a cross-sectional view through the subject matter developed with regard to FIG. 1 with direct linking to a reference-ground potential.

FIG. 4 shows a cross section through a developed tunable capacitance with regard to FIGS. 1 to 3, with the possibility of improving the quality factor even further. In this case, at a few locations relative to the chip area of the tunable capacitance, provision is made of a P+-doped terminal region 8 for connection to a reference-ground potential. The reference-ground potential terminal region 8 has an opposite doping with regard to the well terminal regions 6 usually provided at this location. The reference-ground potential terminal region is introduced into the N-type well 2, and adjoins the gate oxide layer 4. At the locations where the reference-ground potential terminal region 8 is provided, the insulating thick oxide region 3 is also omitted besides the well terminal region 6.

Figure 5:
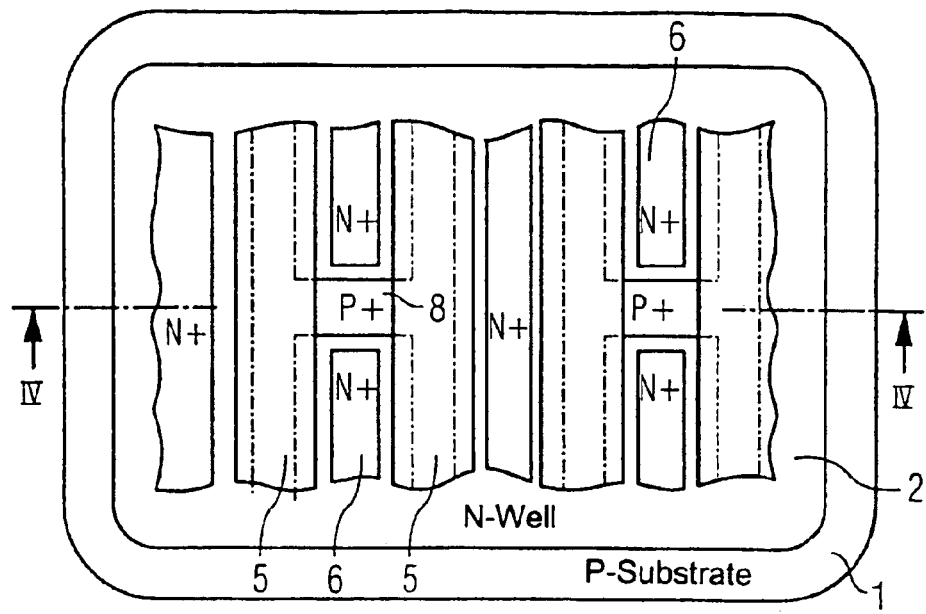
FIG. 5 is a diagrammatic, plan view of a capacitance in accordance with FIG. 4.

FIG. 5 shows a plan view of an integrated tunable capacitance in accordance with FIG. 4. The illustration, not to scale, shows how it is possible to achieve the situation in which the P+-type reference-ground potential terminal regions 8 replace the collector deep implantation regions 6 only at a few locations relative to the entire chip area of the capacitance formed in a finger structure.

Figure 6:
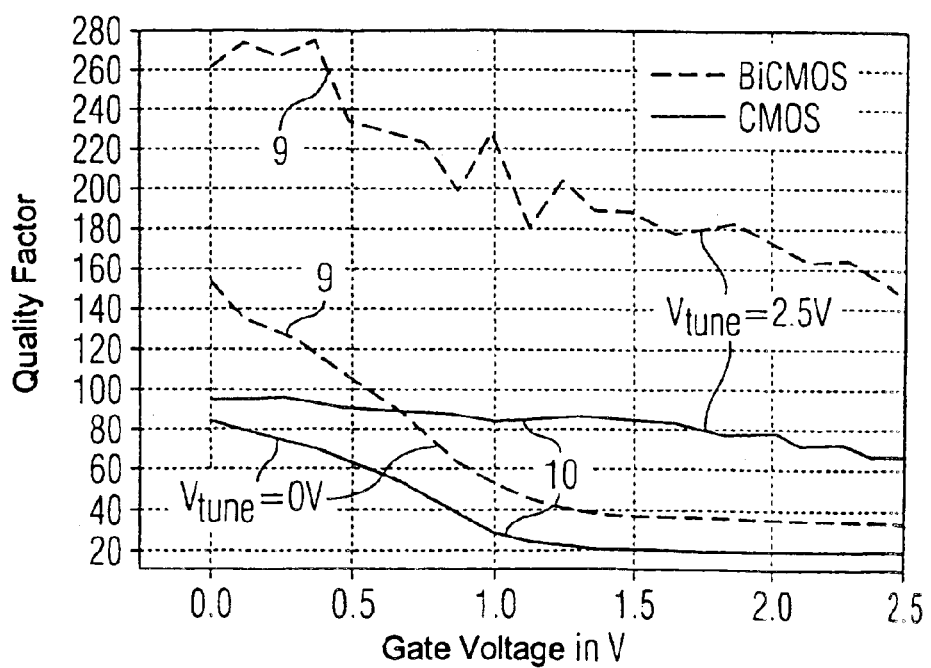
FIG. 6 is a graph showing the profile of a quality factor of an exemplary capacitance according to the invention as a function of the gate voltage with reference to a CMOS reference varactor.

FIG. 6 illustrates the increase in the quality factor that can be achieved with the BiCMOS varactor according to the invention in comparison with a reference varactor produced using CMOS fabrication technology. In this case, the quality factor is plotted as a function of the gate voltage. The tuning voltage of the varactor is additionally plotted as a family parameter first at 0 V and secondly at 2.5 V. The curves associated with the BiCMOS varactor according to the invention are provided with reference symbols 9, and those that are to be assigned to the CMOS varactor are provided with reference symbols 10. In this case, the BiCMOS varactor according to the invention in accordance with curves 9 is formed with P+-type terminal regions for direct linking to reference-ground potential in accordance with FIGS. 4 and 5. It is evident that, with the present subject matter, the minimum quality factor could be improved from 16 to 34 at low well voltage and from 67 to 145 at high well voltage.

In this case, the quality factor of the tunable capacitance is calculated from the series circuit of the variable capacitance C and series resistances R that are possibly present, using the formula $Q=1/\omega RC$ where $\omega$=operating angular frequency and Q=quality factor.

Instead of the exemplary embodiments shown with a P-type substrate 1 and an N-type well 2 and also N+ collector deep implantation regions 6, the present principle can, of course, also be applied to fabrication processes with an N-type substrate. In this case, a P-doped region is to be used as the region 2 in the form of a well, while the collector deep implantation regions 6 and also the buried layer 7 are to be embodied in P+-doped fashion. The direct linkings described are then likewise to be provided with an opposite conductivity type with regard to the exemplary embodiments shown.

I claim:

1. An integrated, tunable capacitance, comprising:
    a semiconductor body having a semiconductor region of a first conductivity type embodied as a well, said semiconductor body being of a second conductivity type;
    at least one first insulating region disposed in said semiconductor body, said first insulating region having a common interface with said semiconductor region and a first layer thickness;
    a second insulating region having a common interface with said semiconductor region and a common interface with said first insulating region;
    a control electrode disposed on said second insulating region; and
    at least one well terminal region for connecting said semiconductor region to a control voltage for tuning the capacitance, said well terminal region having a higher dopant concentration than said semiconductor region and a second layer thickness greater than the first layer thickness.

2. The capacitance according to claim 1, further comprising a buried layer of the first conductivity type having a higher dopant concentration than said semiconductor region, and adjoining said well terminal region.

3. The capacitance according to claim 1, wherein said well terminal region is formed using bipolar fabrication technology.

4. The capacitance according to claim 1, wherein said well terminal region has a common interface with said second insulating region and said semiconductor region below said control electrode.

5. The capacitance according to claim 1, further comprising a further region for connecting to a reference-ground potential, said further region being of the second conductivity type and also highly doped as compared to said semiconductor body and has a common interface with said second insulating region and said semiconductor region below said control electrode.

6. The capacitance according to claim 1, wherein said second insulating region having a third layer thickness, being less than the first layer thickness of said first insulating region.

7. The capacitance according to claim 1, wherein said first insulating region is a shallow trench insulation region.

8. The capacitance according to claim 1, wherein said second insulating region is an oxide layer.

9. The capacitance according to claim 1, wherein said control electrode is a polycrystalline layer.

* * * * *